United States Patent [19]
Boezen

[11] Patent Number: 5,177,454
[45] Date of Patent: Jan. 5, 1993

[54] AMPLIFIER CIRCUIT WITH TEMPERATURE COMPENSATION

[75] Inventor: Hendrik Boezen, Nijmegen, Netherlands

[73] Assignee: U.S. Philips Corporation, New York, N.Y.

[21] Appl. No.: 796,170

[22] Filed: Nov. 22, 1991

[30] Foreign Application Priority Data

Nov. 28, 1990 [NL] Netherlands .................. 9002591

[51] Int. Cl.⁵ ............................................. H03F 3/04
[52] U.S. Cl. .................................... 330/289; 330/296
[58] Field of Search .................. 330/207 P, 288, 289, 330/295, 296, 297, 298

[56] References Cited
U.S. PATENT DOCUMENTS 3,935,478  1/1976  Okada et al. .................. 330/289 X
3,952,258  4/1976  Smolders ........................ 330/289
4,092,613  5/1978  Boubouleix .................... 330/289

Primary Examiner—Steven Mottola
Attorney, Agent, or Firm—Bernard Franzblau

[57] ABSTRACT

A temperature compensated amplifier circuit includes a control transistor and an output transistor having a control electrode coupled to the main current path of the control transistor. The control electrode of the output transistor is also coupled to a current supply element which is connected in series with the main current path of the control transistor for supplying a bias current whose variation as a result of thermal cooupling between the current supply element and the output transistor is smaller than the variation of the part of the bias current through the main current path of the control transistor as a result of thermal coupling between the control transistor and the output transistor.

19 Claims, 2 Drawing Sheets

AMPLIFIER CIRCUIT WITH TEMPERATURE COMPENSATION

BACKGROUND OF THE INVENTION

This invention relates to an amplifier circuit comprising a control transistor and an output transistor whose control electrode is coupled to the main current path of the control transistor. The control transistor is understood to mean the transistor or transistor configuration receiving the control signal and the output transistor is understood to mean the transistor or transistor configuration applying the amplified signal to a load.

It is a common phenomenon that when the temperature rises due to increased dissipation, the differential base-emitter input resistance of a transistor may become negative, that is to say, the base-emitter voltage decreases as the base current increases. This phenomenon is known in the literature as forward second breakdown or thermal breakdown and is caused by the strong positive thermal dependence of the collector current. In a power transistor the collector current will be inclined to concentrate in the central part of the transistor leading to higher dissipation in this central part. Due to above-mentioned thermal dependence, a hot spot may then be developed, more specifically, at high voltages, which leads to the destruction of the transistor.

If a plurality of transistors are connected in parallel as regards their d.c. current setting—this is understood to mean that their base-emitter input circuits on the one hand and their collector-emitter output circuits on the other hand are included in parallel branches—the parallel circuit will become unstable and the current will no longer be uniformly distributed over the parallel branches and in the worst case will flow through only a single branch if the temperature at which the differential input resistance becomes negative is reached. This means that it is not readily possible to arrange a plurality of transistors in parallel in order to tolerate a larger total amount of dissipated power. This phenomenon also occurs in power transistors whose internal structure corresponds to a plurality of parallel-arranged transistors. The same holds for power output stages of integrated circuits comprising parallel-arranged transistors or transistor configurations.

A prior art solution to the problem posed is to include resistors in each of the emitter paths of the parallel-arranged transistors. This causes the differential input resistance to become negative only at a higher dissipation level so that the problem is postponed as it were.

Using resistors in the emitter paths of parallel-arranged transistors, however, leads to a reduction of the range in which the various output transistors can be driven to full voltage swing and hence of the attainable output power. Furthermore, dissipated energy in the form of heat is developed in the resistors. Furthermore, this solution becomes less effective as the base-emitter voltage increases and the collector current decreases.

An amplifier circuit which does not include any resistors in the emitter paths but uses thermal couplings for solving the problem posed is described in U.S. Pat. No. 3,952,258. This known amplifier circuit comprises a plurality of parallel branches each including at least a control transistor and an output transistor. The various control and output transistors are spatially arranged in such a way that each output transistor has a stronger thermal coupling to a control transistor different from the control transistor that has an electrocoupling with the relevant output transistor. Ideally, such a cross-coupling leads to equal currents flowing through the various output transistors despite any differences in temperature. In principle, the power generated by each output transistor is equal but, as a result of a difference that may occur if dissipating heat develops in an output transistor, a disturbance of the thermal balance may still occur. Practice has shown that an ideal thermal cross-coupling cannot be realised and that there will always be a slight instability. The wiring of a cross-coupled structure is furthermore rather complicated, more specifically, if the number of output transistors is greater than two.

SUMMARY OF THE INVENTION

It is an object of the invention to provide an amplifier circuit which avoids the above disadvantages in the prior art and which is arranged so that, even when a plurality of amplifier circuits are arranged in parallel, each of the output transistors continues to operate within its safe working area.

This object is achieved by means of an amplifier circuit of the type mentioned in the preamble, in that the control electrode of the output transistor is also coupled to a current supply element arranged in series with the main current path of the control transistor for supplying a bias current whose variation as a result of thermal coupling between the current supply element and the output transistor is smaller than the variation of the part of the bias current flowing through the main current path of the control transistor as a result of thermal coupling between the control transistor and the output transistor.

As a result, a rising temperature in the output transistor is accompanied by a likewise rising temperature in the control transistor, which causes a relatively larger part of the bias current made available by the current supply circuit to start to flow through the main current path of the control transistor at the cost of the control current to the control electrode of the output transistor. The temperature in the amplifier circuit is stabilized in this manner. The stabilization has its effect inside the unit formed by the amplifier circuit and is not affected when a plurality of such amplifier circuits are connected in parallel.

BRIEF DESCRIPTION OF THE DRAWING

The invention will be discussed in greater detail with reference to the appended drawing, in which.

DESCRIPTION OF THE PREFERRED EMBODIMENTS

Figure 1:
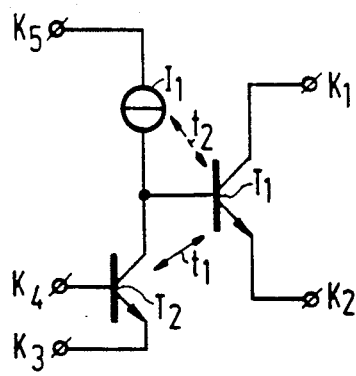
FIG. 1 shows a first embodiment of an amplifier circuit according to the invention, in which the current supply element is constituted by a current source.

FIG. 1 shows an example of an amplifier circuit according to the invention. The circuit comprises an output transistor T1, a control transistor T2 and a current supply element in the form of a current source I1. The main current path of the output transistor T1 is connected to the output terminals K1 and K2. The base of the output transistor T1 is connected to one end of the main current path of the control transistor T2. The other end of the main current path of the control transistor T2 is connected to the terminal K3, whereas the base of the control transistor is connected to the terminal K4. The base of the output transistor T1 is further connected to one end of a current supply element symbolized in FIG. 1 by means of the current source I1. The other end of the current source I1 is connected to the terminal K5.

The spatial configuration of the complete circuit is such that the thermal couplings present between the output transistor T1 and the control transistor T2 and also between the output transistor T1 and the current source I1 will satisfy certain conditions. The thermal coupling between the output transistor T1 and the control transistor T2 is shown symbolically in the drawing figure by means of the double-pointed arrow t1. The thermal coupling between the output transistor T1 and the current source I1 is symbolized by the double-pointed arrow t2. During operation the current flowing through the main current path of the output transistor T1 between the terminals K1 and K2 is determined by the voltage applied to the terminals K3, K4. If, during operation, the temperature of the output transistor T1 rises for whatever reason, the collector current of the control transistor T2 will increase as a result of the thermal coupling between T1 and T2. As a result of the thermal coupling between T1 and I1, the current through the current source I1 also will increase. Therefore, the distribution of the current made available by the current source I1 over the base of T1 and the main current path of T2 will change. According to the invention the strength of the thermal couplings is such that due to the selected spatial configuration of the amplifier, the variation of the current through T1 is stronger than the variation of the current through I1. Consequently, the current increase through T2 is greater than the current increase through I1. As a result, the current through the base of T1 will be reduced so that the current through the main current path of T1 also will be reduced. The dissipation of T1 will thus be reduced and this reduced dissipation will again lead to a temperature drop and thus to a stabilization of the temperature of the whole amplifier.

If a plurality of circuits of the type illustrated in FIG. 1 are arranged in parallel because all equivalent terminals K1, ..., K5 of the relevant circuits are connected to each other, a configuration will be found in which all the output transistors are maintained in principle at substantially the same temperature. If the temperature of one of the output transistors increased for whatever reason, the base current of this output transistor would immediately be reduced due to the above-described mechanism of thermal coupling, so that the dissipation of the output transistor is reduced and the heat increase is thwarted.

Although thermal couplings between T1 and T2 and between T1 and I1 have been assumed hereinbefore, the thermal coupling between T1 and I1 may be reduced to zero. If thermal coupling does exist between T1 and T2, with such a zero thermal coupling between T1 and I1, the amplifier also satisfies the conditions posed according to the invention.

In the example shown in FIG. 1 the current supply element is arranged as the current source I1. Such a current source may be realised by means of a transistor or transistor configuration arranged as a current source or any further circuit components. The current supply element in a simple embodiment may also be realised as a resistor.

Figure 2:
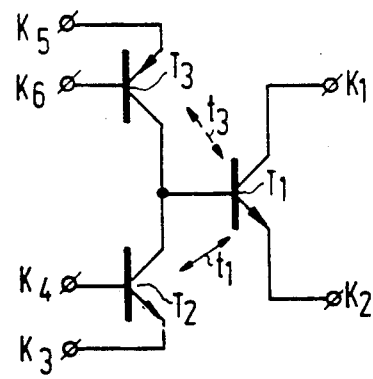
FIG. 2 shows a further embodiment of an amplifier circuit according to the invention in which the current supply element is constituted by a transistor.

Another embodiment of an amplifier circuit according to the invention is illustrated in FIG. 2. In lieu of the current source I1 in FIG. 1, a transistor T3 now is included in the circuit, whose main current path is inserted between the terminal K5 and the base of the output transistor T1. The base of the transistor T3 is connected to a terminal K6. In this circuit too it holds that the variation in the current through T2, caused by thermal coupling t1 between the output transistor T1 and the control transistor T2 is greater than the variation of the current through T3, caused by the thermal coupling between the output transistor T1 and the transistor T3. As observed hereinbefore, the transistor T3 may form a part of a more complicated current supply sub-circuit, as required.

Figure 3:
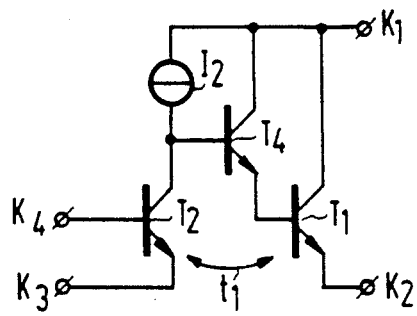
FIG. 3 shows another embodiment of an amplifier circuit according to the invention, in which the output transistor is formed by a Darlington circuit.

FIG. 3 shows an exemplary embodiment in which the output stage is not formed by a single output transistor T1, but by a Darlington circuit made up of transistors T1 and T4. The main current path of the transistor T1 is again inserted between the terminals K1 and K2 and the base of T1 is controlled by the transistor T4 whose main current path is inserted between K1 and the base of T1. The base of T4 is connected to one end of the main current path of the control transistor T2 which is connected in identical manner to that shown in FIG. 1 to the base of T4 and to the terminals K3 and K4. This circuit further includes a current source I2 inserted between the base of T4 and the terminal K1.

Also in this circuit the condition is to be satisfied that the variation of the current through T2 as a result of the thermal coupling t1 between the output transistor T1 and the control transistor T2 is to be greater than the variation of the current through I1 as a result of the thermal coupling between the output transistor T1 and the current source I2 (an arrow referring to this latter thermal coupling is not shown in FIG. 3 for clarity).

It should be observed that this embodiment may also comprise thermal couplings between T4 and T1 and between T4 and T2. Any thermal coupling between T4 and T1 causes the current through the main current path of T1 to increase more strongly when the temperature rises than when this thermal coupling is absent. Any thermal coupling between T4 and T2 results in the current through the main current path of T4 being reduced when the temperature rises, as a result of the same mechanism that causes the current through T1 to decrease. The behaviour of the circuit is therefore hardly affected or not affected at all by these further thermal couplings.

Figure 4:
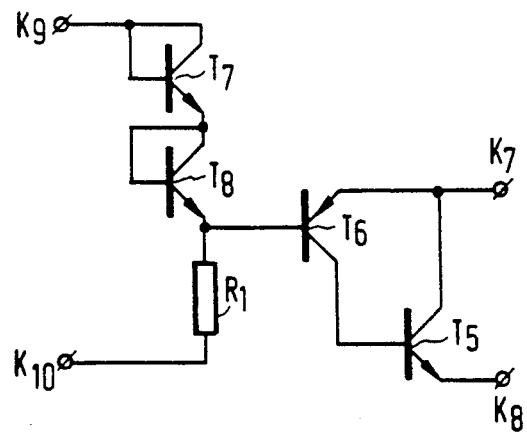
FIG. 4 shows an embodiment of an amplifier stage in which the control transistor configuration is constituted by the series combination of a plurality of diode-arranged transistors.

FIG. 4 shows another embodiment of an amplifier circuit according to the invention. This embodiment comprises an output stage including the transistors T6 and T5 and a control stage including the transistors T7, T8 and the resistor R1. The main current path of the transistor T5 is inserted between the output terminals K7 and K8. The main current path of the transistor T6 is inserted between the terminal K7 and the control terminal T5. The transistors T7 and T8 are both arranged as diodes and included in a series combination together with the resistor R1 inserted between the input terminals K9 and K10. The control electrode of transistor T6 is connected to the node between the series circuit of diodes T7, T8 and the resistor R1 acting as a current supply element.

This embodiment of the amplifier circuit provides a thermal coupling between the diode-arranged transistors T7, T8 and the output transistor T5 as well as a thermal coupling between the current supply element R1 and the transistor T5. If the temperature of the output transistor T5 rises, the temperature of the transistors T7, T8 also will rise as a result of the thermal coupling. Consequently, the forward-directed voltage across these diode-arranged transistors is reduced so that the voltage on the base of T6 is increased causing less current to flow through the main current path of T6. Worded differently, a temperature rise leads to a lower base current in the transistor T5 which prevents any current increase through the main current path of T5. Also in this embodiment the effect of any voltage variation across R1 as a result of thermal coupling between T5 and R1 is to be smaller than the influence exerted by the reduction of the forward-directed voltage across the diode-arranged transistors T7, T8. Worded differently, the thermal couplings are to be realised in such a way that the voltage on the base of T6 increases as the temperature of T5 rises.

Instead of a resistor R1, a current source also may be used. The operation of such an embodiment is completely identical with the above-described operation of the illustrated circuit.

Figure 5:
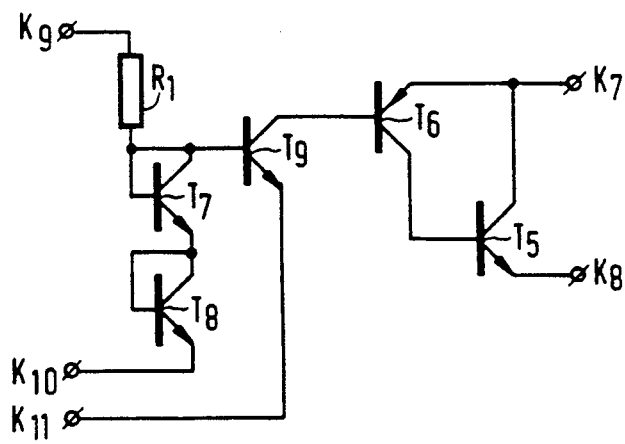
FIG. 5 shows a further elaboration of the embodiment shown in FIG. 4.

A further elaboration of a variant of the embodiment shown in FIG. 4 is illustrated in FIG. 5. In this figure the output stage again comprises transistors T5 and T6 included in the circuit in a similar fashion to FIG. 4. The base current for the transistor T6 is supplied by an additional transistor T9 whose main current path is inserted between the base of transistor T6 and a further terminal K11. The base of T9 is connected to the node between the resistor R1 and the diode-arranged transistors T7, T8. The location of the current supply element R1 and the series combination of the diodes T7, T8 is reversed relative to that shown in FIG. 1. The whole series combination of R1, T7 and T8 is again inserted between the terminals K9 and K10.

This embodiment again comprises a thermal coupling between the output transistor T5 and the diode-arranged transistors T7, T8, whereas, additionally, thermal coupling may occur between the current supply element R1 and the output transistor T5. When the temperature of the output transistor T5 rises, so will the temperature of the diode-arranged transistors T7, T8 leading to a reduction of the forward-directed voltage across these diodes. Consequently, the voltage on the base of T9 will be reduced causing a smaller current to flow through the main current path of T9. Hence, the base current of T6 is reduced which ultimately leads to reduction of the current flowing through the main current path of T5.

Also in the circuit shown in FIG. 5 the resistor R1 may be replaced by a current source, for example, a transistor or transistor configuration arranged as a current source.

Both in FIG. 4 and FIG. 5 the number of diode-arranged transistors may be varied. By including more diodes in the series combination, the temperature control may be made steeper. By means of the number of diodes the control characteristic of the circuit may thus be influenced.

Circuits of the type as shown in FIGS. 1 to 5 may be used in a relatively simple manner as standard power cells. Depending on the desired output power of a power stage, a plurality of these power cells are arranged in parallel by interconnecting the equivalent terminals. The layout of such a configuration is considerably simpler than the layout of a structure known from the state of the art and comprising thermal cross-couplings. An example of such a parallel combination is shown in FIG. 6.

Figure 6:
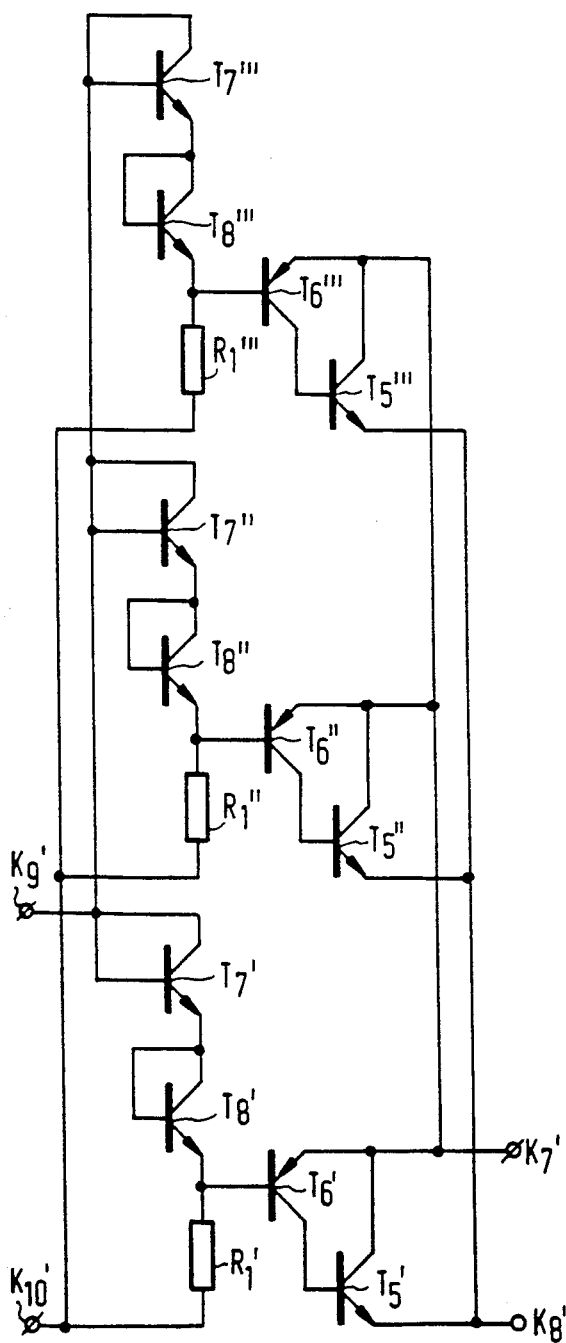
FIG. 6 shows by way of example a parallel configuration of a plurality of circuits of the type illustrated in FIG. 5.

FIG. 6 shows the parallel combination of three circuits of the type illustrated in FIG. 5 by way of example. The parallel combination is realised by interconnecting corresponding input and output terminals. A further discussion of this parallel combination is deemed superfluous after the detailed explanation of FIG. 5. The output power that may be realised by this parallel combination amounts to three times the output power that can be supplied with the sole circuit shown in FIG. 5.

It should be pointed out once again that when a plurality of power cells are included in a parallel combination the temperatures of the various power transistors T1 are maintained substantially equal. This is in contradistinction to the situation with a cross-coupled structure (as described, for example, in above U.S. Pat. No. 3,952,258), in which ideally the currents flowing through the output transistors are maintained equal. This implies that with the same surface of the power transistors and the same maximum permissible node temperature the maximum permissible dissipation when using a configuration according to the invention is greater than when using a cross-coupled configuration.

Figure 7:
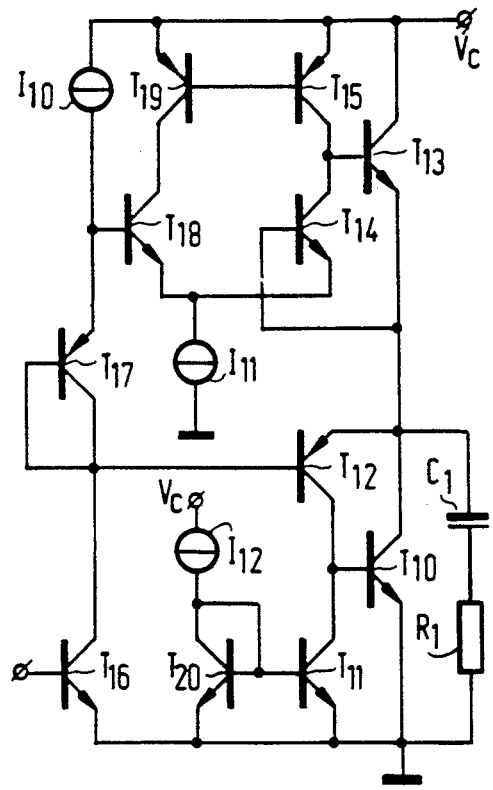
FIG. 7 shows the use of an amplifier circuit according to the invention in a class B output amplifier.

The power cell according to the invention may not only be used in a parallel combination but may also be used for designing, for example, a class B output stage, an example of which is shown in FIG. 7. In this class B output stage two power cells according to the invention are used in which one cell comprises the transistors T10, T11 and T12, whereas the other cell comprises the transistors T13, T14 and T15. The main current paths of the two power transistors T10 and T13 are connected in series and supply current to a load R1 across and output capacitor C1.

The input voltage of the amplifier stage is applied to the base of T16. Through the diode-arranged transistor T17 a control voltage is applied to the base of T18 which, together with the control transistor T14, constitutes a difference stage. This difference stage is connected to the supply voltage terminal Vc through the transistors T15 and T19. The current source circuits I10 and I11 may be realised in any desirable manner.

In the bottom cell comprising the transistors T10, T11 and T12, the control transistor T11 forms a current mirror circuit with a transistor T20 and a current source I12, the transistor T20 being connected to the supply voltage terminal Vc through the latter current source I12.

I claim:

1. An amplifier circuit comprising: a control transistor, an output transistor whose control electrode is coupled to a main current path of the control transistor, and means coupling the control electrode of the output transistor to a current supply circuit connected in series with the main current path of the control transistor, the current supply circuit supplying to the output transistor a bias current whose variation as a result of thermal coupling between the current supply circuit and the output transistor is smaller than the variation of the part of the bias current flowing through the main current path of the control transistor as a result of thermal coupling between the control transistor and the output transistor.

2. An amplifier circuit as claimed in claim 1, wherein current supply circuit comprises a resistor.

3. An amplifier circuit as claimed in claim 1, wherein current supply circuit comprises is a current source.

4. An amplifier circuit as claimed in claim 3, wherein the current source comprises a transistor arranged as a current source.

5. An amplifier circuit as claimed in claim 1 wherein the control transistor comprises a diode.

6. An amplifier circuit as claimed in claim 1, wherein the control transistor comprises a series combination of a plurality of diode-connected transistors.

7. An amplifier circuit as claimed in claim 4 wherein the control transistor comprises a diode.

8. An amplifier circuit as claimed in claim 4, wherein the control transistor comprises a series combination of a plurality of diode-connected transistors.

9. An amplifier circuit as claimed in claim 1 further comprising a transistor coupled between the control electrode of the output transistor and a node between the current supply circuit and the control transistor such that collector current of said transistor flows to the control electrode of the output transistor.

10. A temperature compensated amplifier circuit comprising:
an output transistor having a control electrode,
a current supply circuit and a control transistor connected in series circuit between first and second terminals of a supply voltage,
means coupling the control electrode of the output transistor to a node in said series circuit whereby the current supply circuit supplies a bias current having a first current part that flows to the control electrode of the output transistor and a second current part that flows to the control transistor, and
means for providing a thermal coupling relationship between the output transistor and the control transistor and between the output transistor and the current supply circuit such that a variation in the first current part as a result of the thermal coupling between the output transistor and the current supply circuit is smaller than a variation in the second current part as a result of the thermal coupling between the output transistor and the control transistor.

11. A temperature compensated amplifier circuit as claimed in claim 10 wherein the thermal coupling between the output transistor and the control transistor is greater than the thermal coupling between the output transistor and the current supply circuit.

12. A temperature compensated amplifier circuit as claimed in claim 10 wherein the current supply circuit comprises a current source and wherein a signal input terminal for the amplifier circuit is coupled to a control electrode of the control transistor whereby an input signal is supplied to the control electrode of the output transistor only via the control transistor.

13. A temperature compensated amplifier circuit as claimed in claim 10 wherein the current supply circuit comprises a resistor and the control transistor comprises at least one diode-connected transistor of the same conductivity type as the output transistor.

14. A temperature compensated amplifier circuit as claimed in claim 10 wherein said coupling means comprises a transistor coupled to a node in said series circuit and connected in a Darlington configuration with said output transistor.

15. A temperature compensated amplifier circuit as claimed in claim 10 further comprising, a second output transistor, a second control transistor and a second current supply circuit all connected together in a second amplifier circuit identical to the amplifier circuit comprising the first output transistor, the first control transistor and the first current supply circuit and with similar thermal coupling relationships, wherein an output terminal of the overall temperature compensated amplifier circuit is coupled to an output terminal of the first and second output transistors and each of the series circuits is coupled to said first and second supply voltage terminals whereby the first and second amplifier circuits are connected in parallel with each other.

16. A temperature compensated amplifier circuit as claimed in claim 10 wherein the thermal coupling between the output transistor and the current supply circuit is effectively zero.

17. A temperature compensated amplifier circuit as claimed in claim 10 wherein the current supply circuit comprises a further transistor and wherein a signal input terminal for the amplifier circuit is coupled to a control electrode of the control transistor.

18. A temperature compensated amplifier circuit as claimed in claim 10 wherein said coupling means comprises, a first transistor connected in Darlington circuit configuration with the output transistor and having a control electrode coupled to one main electrode of a second transistor having its control electrode connected to said node in the series circuit and having a second main electrode coupled to a further circuit terminal, and wherein the current supply circuit comprises a resistor and the control transistor comprises at least one diode-connected transistor.

19. A temperature compensated amplifier circuit as claimed in claim 18 wherein said at least one diode-connected transistor, said second transistor and said output transistor are all of one conductivity type and the first transistor is of the opposite conductivity type.

* * * * *